(12) United States Patent
Oza et al.

(10) Patent No.: US 7,203,889 B2
(45) Date of Patent: Apr. 10, 2007

(54) ERROR CORRECTION FOR MEMORY

(75) Inventors: Alpesh B. Oza, Sunnyvale, CA (US); Miguel A. Guerrero, Fremont, CA (US); Rohit R. Verma, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 483 days.

(21) Appl. No.: 10/816,801

(22) Filed: Apr. 1, 2004

(65) Prior Publication Data

US 2005/0229089 A1    Oct. 13, 2005

(51) Int. Cl.
*G11C 29/52* (2006.01)

(52) U.S. Cl. .................. 714/758; 714/763; 714/766

(58) Field of Classification Search ............... 714/758, 714/763, 766; G11C 29/52
See application file for complete search history.

(56) References Cited

U.S. PATENT DOCUMENTS

| | | | |
|---|---|---|---|
| 6,467,060 B1* | 10/2002 | Malakapalli et al. | 714/758 |
| 6,701,480 B1* | 3/2004 | Karpuszka et al. | 714/764 |
| 2003/0058873 A1* | 3/2003 | Geiger et al. | 370/401 |

* cited by examiner

*Primary Examiner*—R. Stephen Dildine
(74) *Attorney, Agent, or Firm*—Fish & Richardson P.C.

(57) ABSTRACT

A memory controller includes a write data module to write user data, parity information, and error correction information in a memory. The memory controller includes a read data module to read the user data and parity information, determine whether there is error in the user data based on the parity information, read the error correction information if there is error as determined based on the parity information.

30 Claims, 7 Drawing Sheets

ERROR CORRECTION FOR MEMORY

BACKGROUND

When data are stored in a memory device, soft errors can occur that result in data loss or incorrect execution of instructions. One type of error code bits are parity bits that are used to detect the existence of errors but generally cannot correct errors. Another type of error code bits are error correction codes that can be used to detect and correct the errors.

DETAILED DESCRIPTION

Figure 1:
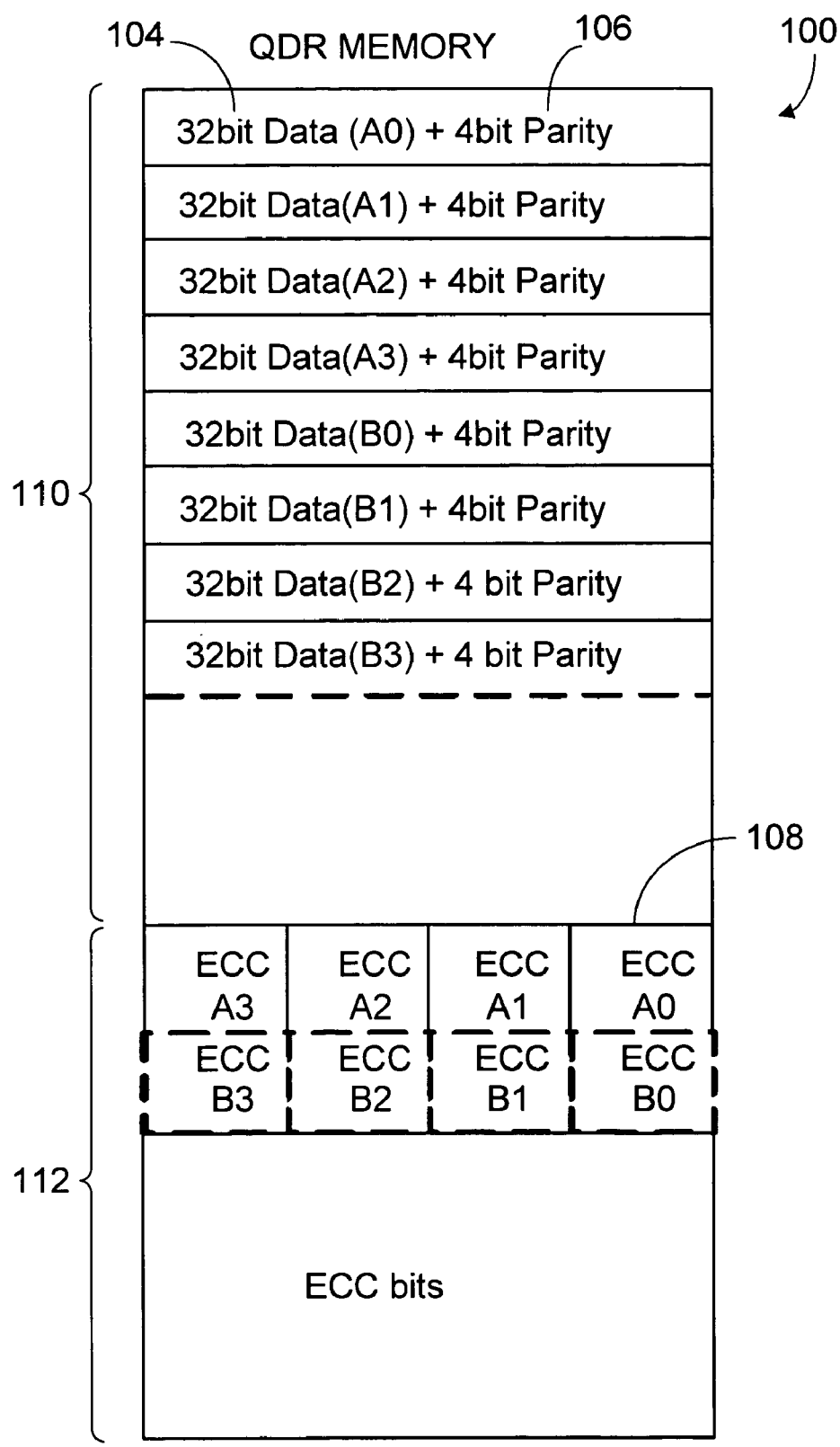
FIG. 1 shows a memory that stores user data, parity information, and error correction information.

Referring to FIG. 1, a memory 100 has a first memory region 110 that stores user data and parity information, and a second memory region 112 that stores error correction information. The user data is stored as 32-bit data words 104, each associated with a 4-bit parity code 106 and a 7-bit error correction code 108. A read instruction causes a 32-bit user data 104 and a 4-bit parity code 106 to be read from the first memory region 110. The parity code 106 is analyzed to determine whether there is error in the user data 104. If there is error, a corresponding 7-bit error correction code 108 is read from the second memory region 112 to correct the error. If there is no error, the error correction code 108 is not read. This allows error correction functionality to be easily implemented in a system designed to access 32-bit data words in the memory using a 36-bit wide data bus (or a 18-bit wide data bus using burst-of-two access, or a 9-bit wide data bus using burst-of-four access).

The term "user data" is used generally to refer to data that is different from the parity information and the error correction information. The parity information is used to determine whether there is error in the user data, and the error correction information is used to correct error, if any, in the user data. The user data can be control data used to control processing of other data, such as network data packets. The user data is sometimes referred to as write data when write operations are involved, and referred to as read data when read operations are involved.

The memory 100 can be a quad-data-rate static random access memory (QDR™ SRAM) that is used in a network processor. Many commercially available QDR SRAM products use data buses that are 9, 18, or 36 bits wide. When a QDR SRAM using a 9-bit data bus is operated using burst-of-four read/write operations, each read/write operation accesses 9×4=36 bits of data. Likewise, when a QDR SRAM using a 18-bit data bus is operated using burst-of-two read/write operations, each read/write operation accesses 18×2=36 bits of data. The 36 bits of data can include 32 bits of user data and 4 bits of parity information.

Figure 2:
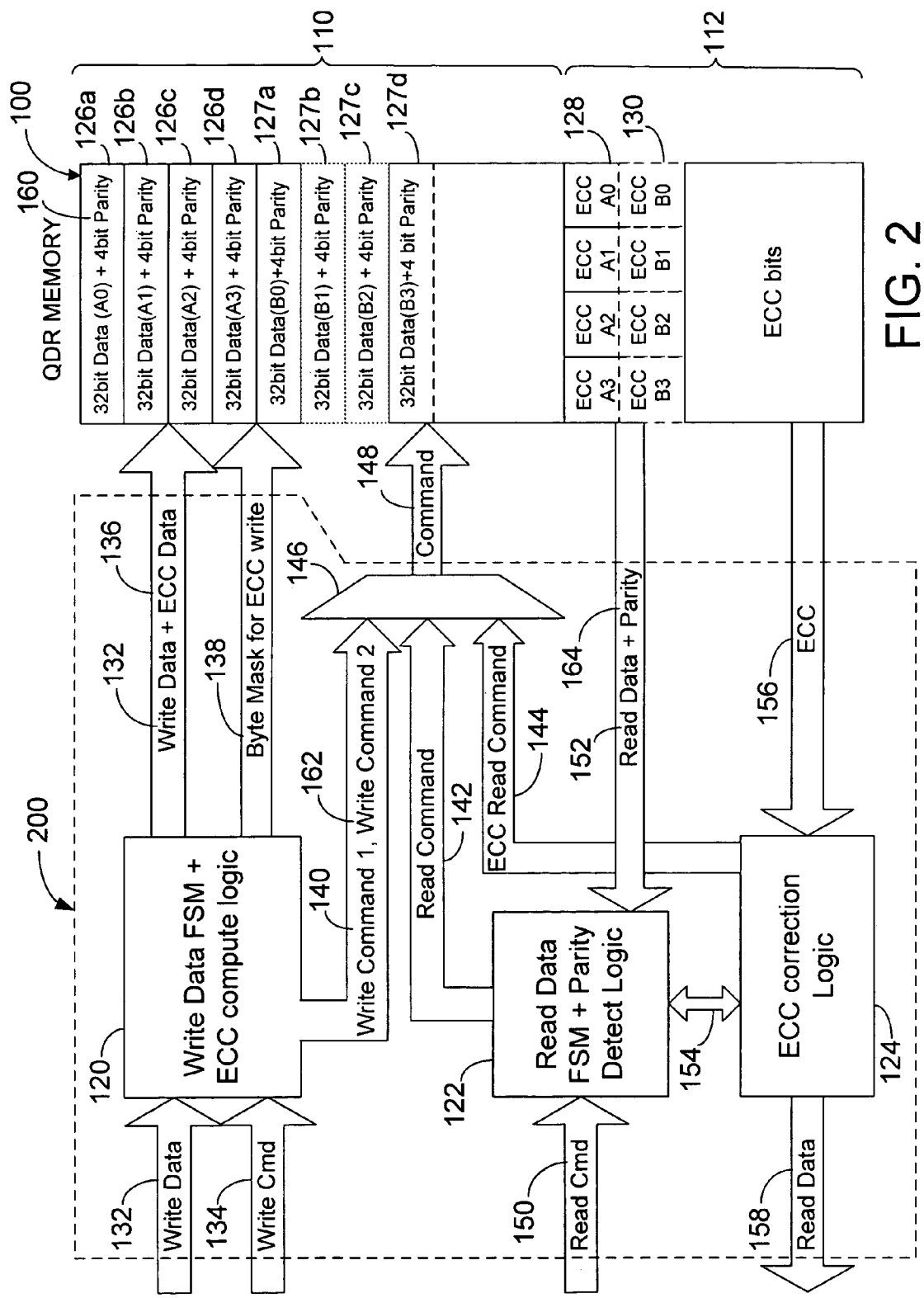
FIG. 2 shows a memory controller that implements error correction for read and write operations.

Referring to FIG. 2, a memory controller 200 interfaces with a commercially available QDR memory 100 and implements error correction functionality by using a write data module 120, a read data module 122, and an ECC correction module 124. The write data module 120 writes write data to the first memory region 110, and writes error correction information to the second memory region 112. Each address (e.g., 126a, 126b, 126c) in the first memory region 110 corresponds to an address (e.g., 128, 130) in the second memory region 112. For example, the error correction code (ECC A0), which is associated with the user data (A0) stored at the address 126a is stored in the first byte at address 128. The error correction code (ECC A1) associated with the user data (A1) stored at address 126b is stored in the second byte at address 128, and so forth.

A 7-bit error correction code can correct an error in a 32-bit user data, and four 7-bit error correction codes can be stored at a single address (e.g., 128 or 130), which corresponds to 36 bits of memory space. In this example, the error correction codes (e.g., ECC A0, ECC A1, ECC A2, ECC A3) stored at address 128 correspond to the user data A0 to A3 stored at addresses 126a to 126d, respectively. The error correction codes (e.g., ECC B0, ECC B1, ECC B2, ECC B3) stored at address 130 correspond to the user data B0 to B3 stored at addresses 127a to 127d, respectively, and so forth.

The write data module 120 receives a 32-bit write data 132 and a write command 134 that requests the write data 132 to be written to a particular address in the memory 100. The write data module 120 calculates an error correction code 136 based on the write data 132 using a conventional error correction code technique, e.g., linear block codes, Hamming codes, or convolutional codes. The write data module 120 sends the write data 132 and a write command 140 to the memory 100. The write command 140 passes through a multiplexer 146, which multiplexes the write command 140 with other commands and forwards the multiplexed commands 148 to the memory 100. When the memory 100 receives the write data 132 and the write command 140, a parity generator (not shown) in the memory 100 determines a 4-bit parity code (e.g., 160) associated with the write data 132. The write data 132 and the parity code are written into memory at an address (e.g., 126a) designated by the write command 140.

The write data module 120 determines an address for the error correction code based on, for example, a predetermined formula. For example, (address of error correction code)=(address of write data)/4+offset, where offset is the starting address of the first error correction code. The write data module 120 generates a byte mask 138 for the error correction code 136 and sends the byte mask 138, the error correction code 136, and another write command 162 to the memory 100. The write command 162 includes an address (e.g., 128) in the memory region 112 where the error correction code 136 is to be stored.

The byte mask 138 determines which byte at the address (e.g., 128) is to store the error correction code. For example, the write data in address 126a is associated with the error correction code ECC A0, which is stored in the first byte at address 128. In this example, the byte mask 138 masks off the $2^{nd}$ to $4^{th}$ bytes at the address 128, so that the ECC is written into the $1^{st}$ byte. Likewise, the write data 132 in address 127b is associated with the error correction code ECC B1, which is stored in the $2^{nd}$ byte at address 130. In this example, the byte mask 138 masks off the $1^{st}$, $3^{rd}$, and $4^{th}$ bytes at the address 130, so that the ECC is written into the $2^{nd}$ byte.

In the example above, two instruction cycles are used to write a 32-bit data into the memory 100. In the first cycle, the write command 140 causes the write data to be written into the memory region 110. In the second cycle, the write command 162 causes the error correction code to be written into the memory region 112.

The memory controller 200 includes a read data module 122 that receives a read command 150 that requests data to be read from a particular address in the memory 100. The read data module 122 sends a read command 142 to the memory 100 (through the multiplexer 146), which causes a 32-bit read data 152 and the associated 4-bit parity code 164 to be read from the memory region 110. The read data module 122 determines whether there is an error in the read data 152 based on the parity code 164. If there is no error, the read data 152 is passed to an ECC correction module 124 and output as read data 158.

If the read data module 122 determines that there is error based on the parity code 164, the read data module 122 instructs the ECC correction module 124 to send an ECC read command 144 to the memory 100 (through the multiplexer 146). This causes an error correction code 156 to be read from the memory 100. The ECC correction module 124 corrects the error in the read data 152 based on the error correction code 156 and outputs the read data 158, which has been corrected for error.

The write data 132, the write command 134, and the read command 150 may be sent from, for example, a data processor (not shown). The read data 158 may be sent to the data processor.

The memory controller 200 is useful in implementing error correction functionality in a system designed to access 32 bits of data per read/write operation. The write data module 120 requires two instruction cycles to write data and error correction information into the memory 100. The read data module 122 reads the error correction information only when there is error in the read data 152 (as determined based on the parity information 164). Because soft errors occur infrequently, the percentage of read operations that require a subsequent reading of the error correction information is low. In a system where a read operation is performed more frequently than a write operation, the memory controller 200 provides error correction functionality while having a small impact on data access throughput.

Figure 3:
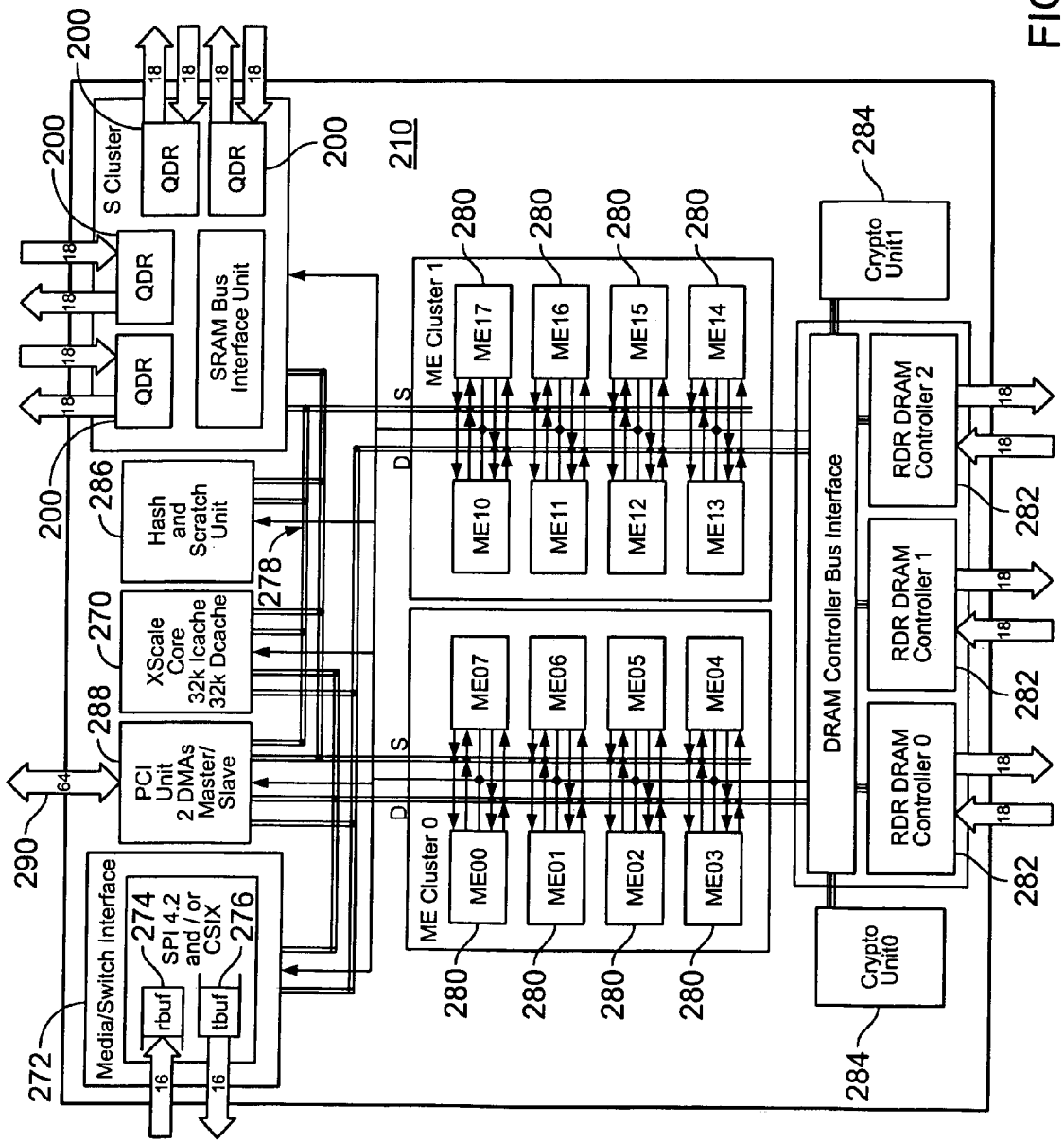
FIG. 3 shows a network processor that includes the memory controller of FIG. 2.

Referring to FIG. 3, the memory controller 200 can be used in a network processor 210 that is used to process data packets sent over a network. In this example, the network processor 210 has four QDR SRAM memory controllers 200 to control access to QDR SRAM devices. The four memory controllers 200 allow access to four independent memory channels to provide sufficient control information bandwidth for 10-gigabit network applications. SRAM devices are useful for storing control information, which tends to have many small data structures such as queue descriptors and linked lists. SRAM devices allow for small access size, and allow for access to an arbitrary address sequence. In one example, each memory controller 200 runs at 200 MHz, provides 800 MB/s of read bandwidth and 800 MB/s of write bandwidth.

The memory controllers 200 also provide the following functions: (1) Atomic read-modify-write operations, such as increment, decrement, add, subtract, bit-set, bit-clear, and swap. (2) Linked-list queue operations, such as enqueue and dequeue to linked-list operations. (3) Ring operations, including inserting data at the tail of a ring or removing data from the head of the ring.

The network processor 210 includes microengines 280 that process data packets. There are 16 microengines 280 that are configured as two clusters of eight microengines to provide more communication capability between the microengines and the remainder of the processor resources.

An embedded processor 270 handles exception packets and performs management tasks. A media and switch fabric interface 272 is used to connect the network processor 210 to a physical layer device and/or a switch fabric. The switch fabric interface 272 includes a receive buffer 274 to receive incoming packets and a transmit buffer 276 to hold outgoing packets.

A bus system 278 interconnects the units within the network processor 210, and includes data busses that connect the microengines 280 to various shared resources, such as SRAM, dynamic random access memory (DRAM), hash, and cryptography units, described below.

Three independent DRAM controllers 282 control external DRAM devices, and allow access to three independent channels to provide sufficient data buffering bandwidth for 10-gigabit network applications. DRAM devices are useful for data buffering because they offer good burst bandwidth and can be denser and cheaper per bit relative to SRAM devices.

Cryptography units 284 perform authentication and bulk encryption. A hash and scratch unit 286 implements hash functions to detect collisions, and has a small on-chip scratchpad memory, which functions similarly to an external SRAM device, but with a lower latency.

A PCI unit 288 provides an interface to a PCI data bus 290. The PCT unit 288 can be used to interface with an external control microprocessor, or be used to interface with an external device, such as a public key accelerator. The PCI unit can act as a PCI bus master, allowing the embedded processor 270 or microengines 280 to access external PCI targets, or as a PCI bus target, allowing external devices to transfer data to and from the external SRAM and DRAM devices coupled to the network processor 210.

Figure 4:
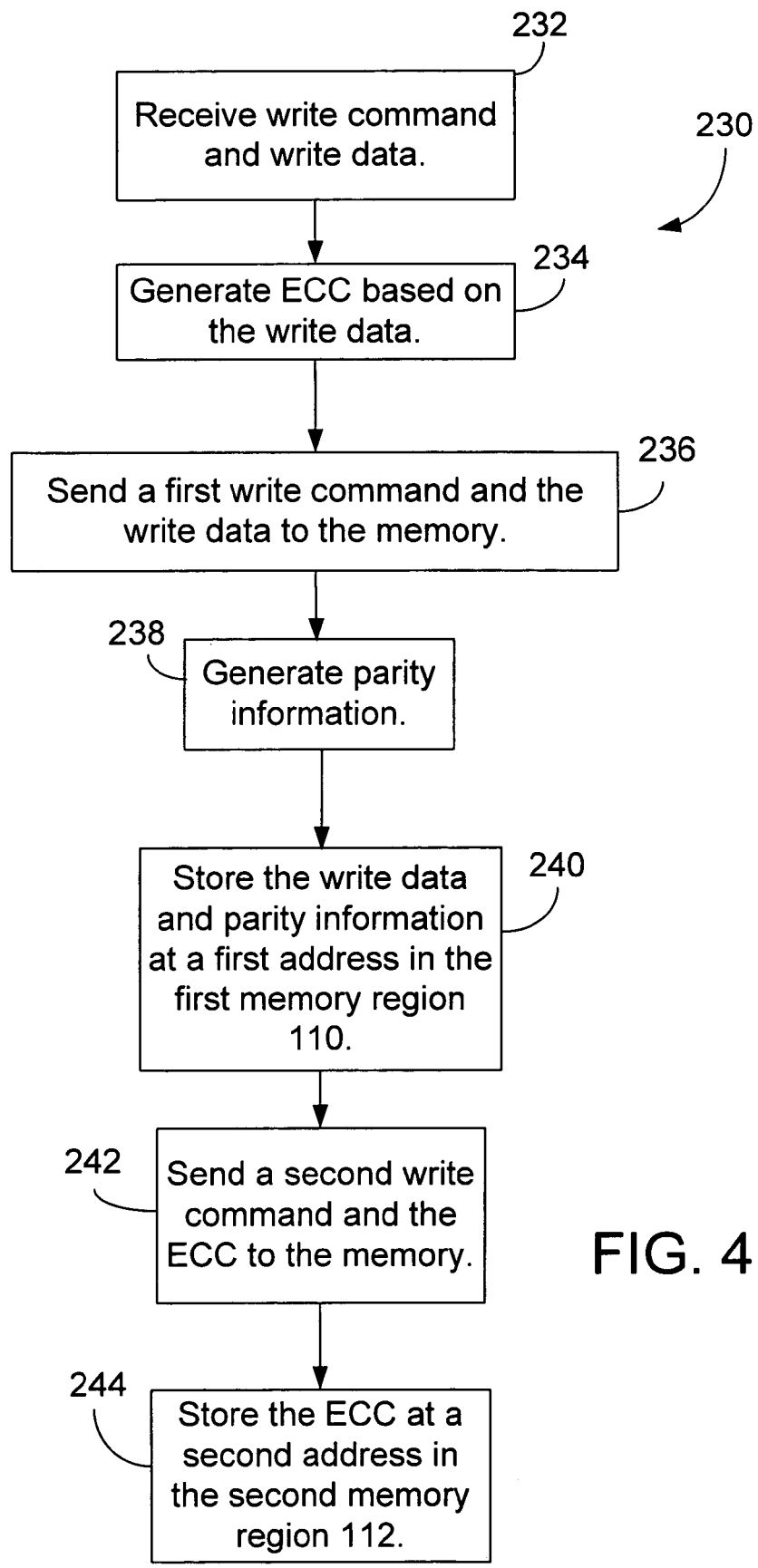
FIG. 4 shows a process for writing data and error correction information into the memory device of FIG. 1.

Referring to FIG. 4, a process 230 for writing data and error correction information to the memory 100 is shown. The write data module 120 in the memory controller 200 receives (232) a write command and write data from a data processor. The write data module 120 generates (234) error correction code based on the write data. The write data module 120 sends (236) a first write command and the write data to the memory 100. A parity generator in the memory 100 generates (238) a parity code associated with the write data. The write data and the associated parity code are stored (240) at a first address in the first memory region 110. The write data module 120 sends (242) a second write command and the error correction code to the memory 100. The error correction code is stored (244) at a second address in the second memory region 112.

Figure 5:
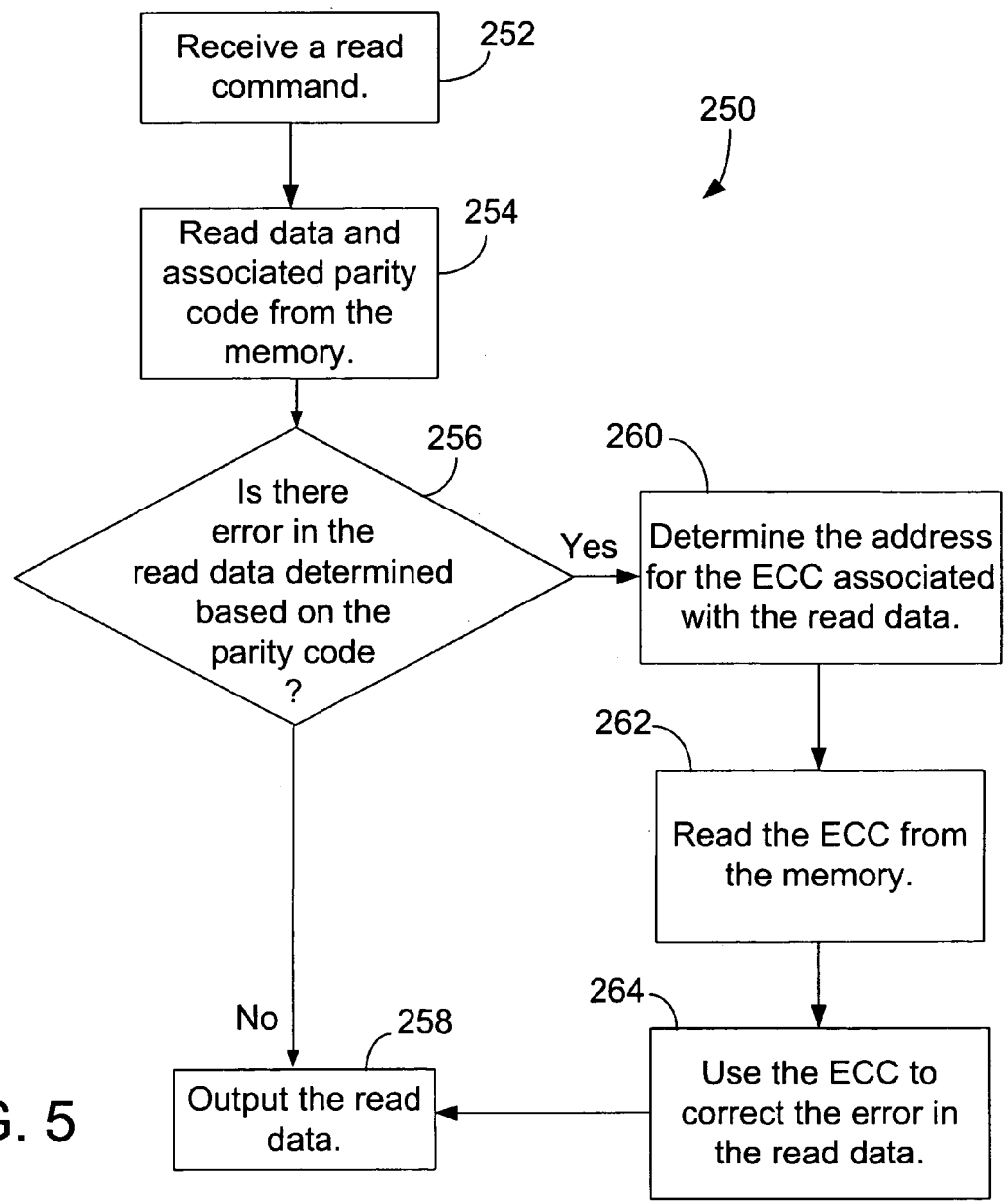
FIG. 5 shows a process for reading data and, if there is an error, correcting the error to output accurate data.

FIG. 5 illustrates a process 250 for reading data from the memory 100 and correcting error, if any, in the read data. The read data module 122 in the memory controller 200 receives (252) a read command. The read data module 122 sends the read command to the memory 100, causing read data and associated parity code to be read (254) from the memory 100. The read data module 122 determines (256) whether there is error in the read data based on the parity code. If there is no error, the read data is output (258) to the data processor. If there is error, the error correction module 124 determines (260) the address of the error correction code that is associated with the read data. The error correction module 124 reads (262) the error correction code from the memory 100, and uses the error correction code to correct (264) the error in the read data. The corrected read data is output (258) to the data processor.

Figure 6:
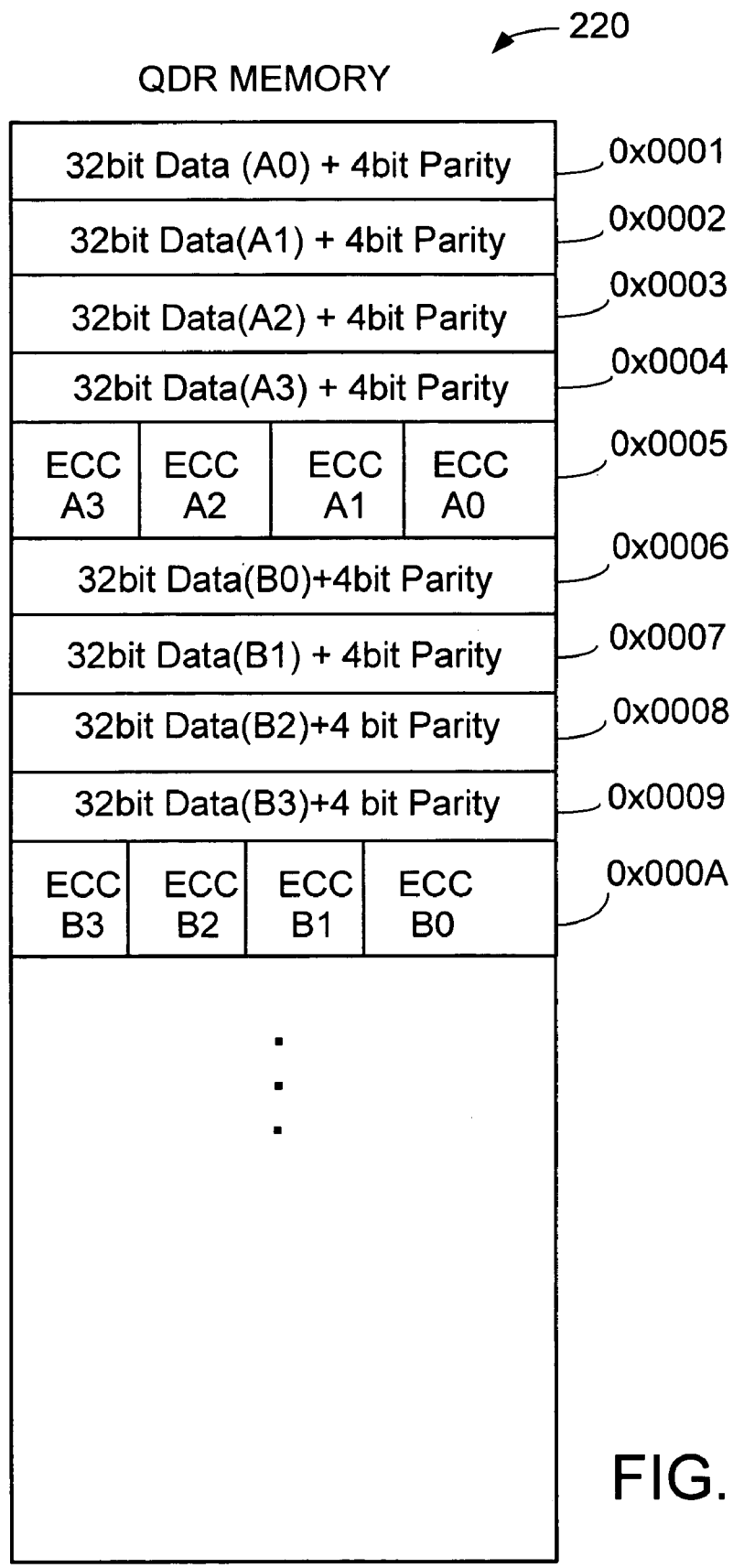
FIG. 6 shows a memory that stores user data, parity information, and error correction information.

Referring to FIG. 6, in a memory 220, the user data and the error correction codes are interleaved so that four 32-bit data words are followed by four error correction codes. For example, user data is stored at addresses 0x0001 to 0x0004, followed by error correction information stored at address 0x0005, and user data stored at addresses 0x0006 to 0x0009 is followed by error correction information stored at address 0x000A. The memory controller 200 maps virtual addresses (e.g., addresses recognized by a data processor) to physical addresses (i.e., actual addresses in the memory 220). For example, virtual addresses 0x0001 to 0x0004 map to physical addresses 0x0001 to 0x0004, respectively, and virtual addresses 0x0005 to 0x0008 map to physical addresses 0x0006 to 0x0009, respectively, and so forth. When the user data (e.g., A0) is read from an address (e.g., 0x0001), the associated error correction code (e.g., ECC A0 at address 0x0005) is not read unless there is error in the user data based on the parity code.

The user data 104 can have lengths different from 32 bits, the parity codes can have lengths different from 4 bits, and the error correction codes can have lengths different from 7 bits. Memory 100 is not limited to QDR SRAM, and can be other types of memory, such as conventional SRAM, MoSys® 1T-SRAM, conventional DRAM, fast page mode DRAM, extended data out (EDO) DRAM, burst EDO DRAM, pipeline burst EDO DRAM, synchronous DRAM, enhanced synchronous DRAM, virtual channel DRAM, reduced latency DRAM, fast cycle DRAM, Direct Rambus DRAM, etc.

Figure 7:
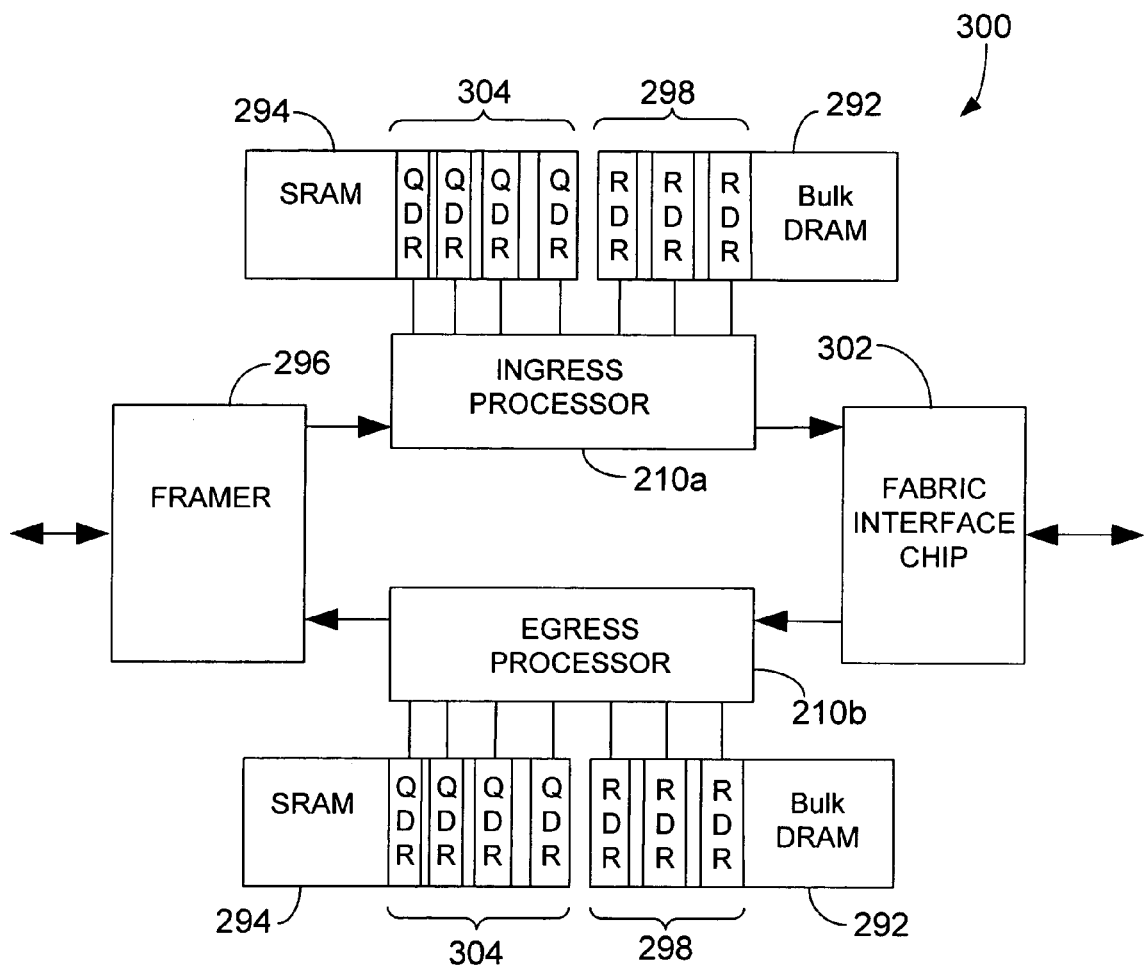
FIG. 7 shows an Ethernet switch blade 300 that includes the network processor of FIG. 3.

Referring to FIG. 7, an example of a 10-gigabit Ethernet switch blade 300 includes a network processor 210a for ingress processing and a network processor 210b for egress processing. Ingress processing tasks may include classification, metering, policing, congestion avoidance, statistics, segmentation, and traffic scheduling into a switch fabric. Egress processing tasks may include reassembly, congestion avoidance, statistics, and traffic shaping. Input and output buffering are supported using buffers in DRAM devices 292 linked together by linked lists maintained in SRAM devices 304.

The ingress and egress network processors 210a, 210b present a full-duplex interface to a switch fabric through interface chip 302. Packets are streamed into the ingress network processor 210a at or above line rate. The packets are received, reassembled, processed, buffered into the DRAM devices 292, and enqueued for transmission into the switch fabric. Similarly, the egress network processor 210b receives packets from the fabric interface 302, reassembles, processes, and buffers the packets in the DRAM devices 292, and queues the packets for outgoing transmission through an egress framer 296.

In one example, a DRAM interface 298 includes three Rambus™ DRAM channels operating at a clock rate of up to 533 MHz, offering an aggregate peak bandwidth of 51 Gb/s. An SRAM interface 304 includes four QDR II SRAM channels that may be clocked up to 250 MHz. Each interface supports an independent read and write port, providing an aggregate read rate of 32 Gb/s and, simultaneously, an aggregate write rate of 32 Gb/s. This configuration provides a cost-effective and flexible approach to basic packet processing at 10 Gb/s rates.

Although some examples have been discussed above, other implementations and applications are also within the scope of the following claims. For example, the locations for storing error correction information may be arranged differently from what is shown in FIG. 1 and FIG. 6. The memory controller 200 can operate in different speeds and can be used in different types of machines.

What is claimed is:

1. An apparatus comprising:
   a write data module to write user data, parity information, and error correction information in a memory; and
   a read data module to read the user data and parity information, determine whether there is error in the user data based on the parity information, and read error correction information if there is error as determined based on the parity information.

2. The apparatus of claim 1, wherein the read data module does not read the error correction information if there is no error.

3. The apparatus of claim 1, wherein the user data and error correction information are stored in the memory such that the user data are read without reading the error correction information in the same read access to the memory.

4. The apparatus of claim 1, wherein the memory has a first set of addresses and a second set of addresses, each of the first set of addresses associated with user data, and each of the second set of addresses associated with error correction information corresponding to the user data.

5. The apparatus of claim 4, wherein each unit of user data associated with an address in the first set of addresses is shorter than 64 bits.

6. The apparatus of claim 4, wherein each address in the first set of addresses corresponds to an address in the second set of addresses, the error correction information associated with the address in the second set of addresses being used to correct one or more bits of error in the user data associated with the corresponding address in the first set of addresses if there is error in the user data.

7. The apparatus of claim 4, wherein each address in the second set of addresses is associated with more than one unit of error correction information, each unit of error correction information being used to correct one or more errors in the user data associated with an address in the first set of addresses.

8. The apparatus of claim 1, further comprising an error correction module to correct one or more errors in the user data based on the error correction information if there is error in the user data.

9. An apparatus comprising:
   a write data module to write a user data unit into a first memory region of a memory, compute an error correction code unit corresponding to the user data unit, and to store the error correction code unit in a second memory region of the memory so that the user data unit can be read independently of reading the error correction code unit.

10. The apparatus of claim 9, wherein the write data module writes a plurality of user data units into a corresponding plurality of addressable locations in the first region of memory and writes a like plurality of error correction code units into a second plurality of addressable locations in the second region of memory.

11. The apparatus of claim 10, wherein each user data unit comprises 32 bits of user data, and each error correction code unit comprises 7 bits of error correction code.

12. The apparatus of claim 9, wherein the write data module also writes a parity bit unit in the first memory region, the parity bit unit used to determine whether there is an error in the user data unit.

13. The apparatus of claim 12, further comprising a read data module to read the user data unit and the parity bit unit from the first memory region, determine whether there is an error in the user data unit based on the parity bit unit, and read the error correction code unit in the second memory region if there is an error.

14. The apparatus of claim 13, wherein the read data module does not read the error correction code unit if there is no error in the user data unit.

15. An apparatus comprising:
a memory storing a user data unit in a first memory region and an error correction code unit at a second memory region, the error correction code unit used to correct one or more bits of error in the user data unit if error occurs, the second memory region being in a different address location from the first memory region so that the user data can be read independently of reading the error correction code unit.

16. The apparatus of claim 15, wherein a plurality of user data units are stored in a corresponding plurality of addressable locations in the first region of memory, and a like plurality of error correction code units are stored in a second plurality of addressable locations in the second region of memory.

17. The apparatus of claim 15, wherein more than one error correction code unit is stored at a common address in the second memory region.

18. A network router comprising:
a network processor;
a memory; and
a memory controller in communication with the network processor having a write data module and a read data module,
the write data module to write user data, parity information, and error correction information in the memory,
the read data module to read the user data and parity information, determine whether there is error in the user data based on the parity information and read error correction information if there is error as determined based on the parity information.

19. The network router of claim 18, wherein the memory comprises static random access memory.

20. The network router of claim 18, wherein the memory controller has an error correction module to correct one or more errors in the user data based on the error correction information if there is error in the user data.

21. A method comprising:
storing user data, parity information, and error correction information in a memory;
reading the user data and parity information from the memory;
determining whether there is error in the user data based on the parity information; and
reading the error correction information if there is error as determined based on the parity information.

22. The method of claim 21, wherein the error correction information is not read if there is no error.

23. The method of claim 21, wherein storing user data, parity information, and error correction information in the memory comprises storing the user data and the error correction information in different memory regions so that the user data can be read independently of reading the error correction information.

24. A method comprising
storing user data in a first memory region; and
storing error correction information in a second memory region so that the user data can be read independently of reading the error correction information, the error correction information used to correct error in the user data.

25. The method of claim 24, further comprising writing parity information in the first memory region so that a read instruction causes the user data and corresponding parity information to be read from the memory.

26. The method of claim 25, further comprising reading the user data and the parity information, determining whether there is an error in the user data based on the parity information, and reading the error correction information if there is an error.

27. The method of claim 26, wherein the error correction information is not read if there is no error in the user data.

28. A machine-accessible medium having instructions stored thereon, the instructions when executed cause a machine to perform operations comprising:
storing user data, parity information, and error correction information in a memory;
reading the user data and parity information from the memory;
determining whether there is error in the user data based on the parity information; and
reading the error correction information if there is error as determined based on the parity information.

29. The machine-accessible medium of claim 28, further comprising instructions that when executed cause the machine to perform operations comprising storing the user data and the error correction information in different memory regions so that the user data can be read independently of reading the error correction information.

30. The machine-accessible medium of claim 28, further comprising instructions that when executed cause the machine to perform operations comprising storing the user data in units less than 64 bits in the memory, and storing the error correction information in units less than 8 bits in the memory.

* * * * *